United States Patent [19]
Shufflebotham et al.

[11] Patent Number: 5,669,977
[45] Date of Patent: Sep. 23, 1997

[54] SHAPE MEMORY ALLOY LIFT PINS FOR SEMICONDUCTOR PROCESSING EQUIPMENT

[75] Inventors: Paul Kevin Shufflebotham, San Jose; Christopher Griffin, Milpitas, both of Calif.

[73] Assignee: LAM Research Corporation, Fremont, Calif.

[21] Appl. No.: 577,520

[22] Filed: Dec. 22, 1995

[51] Int. Cl.$^6$ ................................................ C23C 16/00
[52] U.S. Cl. .................... 118/728; 118/729; 118/500; 156/345
[58] Field of Search ........................... 118/728, 729, 118/730, 500, 715; 156/345

[56] References Cited

U.S. PATENT DOCUMENTS

| | | | |
|---|---|---|---|
| 4,340,462 | 7/1982 | Koch | 204/298.35 |
| 4,431,473 | 2/1984 | Okano et al. | 156/345 |
| 4,554,611 | 11/1985 | Lewin | 361/234 |
| 4,615,755 | 10/1986 | Tracy et al. | 156/345 |
| 4,665,906 | 5/1987 | Jervis | 128/92 YN |
| 4,704,306 | 11/1987 | Nakamura | 427/100 |
| 4,733,632 | 3/1988 | Ohmi et al. | 118/729 |
| 4,743,079 | 5/1988 | Bloch | 439/161 |
| 4,790,258 | 12/1988 | Drage et al. | 118/500 |
| 4,842,683 | 6/1989 | Cheng et al. | 156/345 |
| 4,894,100 | 1/1990 | Yamauchi et al. | 148/402 |
| 4,948,458 | 8/1990 | Ogle | 156/643 |
| 5,197,720 | 3/1993 | Renz et al. | 269/48.1 |
| 5,200,232 | 4/1993 | Tappan et al. | 427/569 |
| 5,215,619 | 6/1993 | Cheng et al. | 156/345 |
| 5,380,396 | 1/1995 | Shikida et al. | 156/630 |

FOREIGN PATENT DOCUMENTS 61-271863  12/1986  Japan .

OTHER PUBLICATIONS

*Development of Energy–Saving Materials Utilizing Superelasticity*, Kazuhiro Otsuka and Shuichi Miyazaki, Institute of Materials Science, (Jan. 1984), pp. 51–57.

*Designing With the Shape Memory Effect*, T.W. Duerig and K.N. Melton, Materials Research Society International Symposium Proceedings, vol. 9, (1989), pp. 581–597.

*Primary Examiner*—Richard Bueker
*Assistant Examiner*—Jeffrie R. Lund
*Attorney, Agent, or Firm*—Burns, Doane, Swecker & Mathis, LLP

[57] ABSTRACT

A lift pin arrangement for use in semiconductor processing apparatus wherein the lift pins are of a shape memory alloy. The lift pins exhibit superelasticity and/or shape memory effects which allows the lift pins to withstand substantial bending forces without permanent deformation thereof, and in the case where the lift pins become deformed it is possible to restraighten the lift pins simply by heating the lift pins to an appropriate temperature.

25 Claims, 2 Drawing Sheets

SHAPE MEMORY ALLOY LIFT PINS FOR SEMICONDUCTOR PROCESSING EQUIPMENT

FIELD OF THE INVENTION

The invention relates to a lift pin arrangement for lifting substrates such as semiconductor wafers or flat panel display substrates.

BACKGROUND OF THE INVENTION

Various types of equipment exist for semiconductor ion implantion, sputtering, rapid thermal processing (RTP), photolithography, chemical vapor deposition (CVD) and flat panel display fabrication processes wherein etching, resist stripping, passivation, deposition, and the like, are carried out. In such systems, it is necessary to transport and/or support the substrate by lift pin mechanisms. Such lift pin mechanisms can be used in temporarily supporting the substrates during transfer, thermal, chemical, optical and other treatments of the substrates.

Plasma generation is used in a variety of such semiconductor fabrication processes. Plasma generating equipment includes parallel plate reactors such as the type disclosed in commonly owned U.S. Pat. No. 4,340,462, electron cyclotron resonance (ECR) systems such as the type disclosed in commonly owned U.S. Pat. No. 5,200,232 and inductively coupled plasma systems such as the type disclosed in commonly owned U.S. Pat. No. 4,948,458. In such plasma processing systems, it is conventional to support the substrate to be treated on a substrate holder within a portion of a plasma process chamber. Further, it is conventional to hold the substrate on the substrate holder by mechanical and/or electrostatic clamping mechanisms. An example of a mechanical clamping system is disclosed in U.S. Pat. No. 4,615,755 and an example of an electrostatic chucking (ESC) arrangement is disclosed in U.S. Pat. No. 4,554,611.

In order to transfer a substrate such as a wafer into a substrate processing chamber, it is conventional to utilize robot arm and lift pin arrangements such as the types disclosed in U.S. Pat. Nos. 4,431,473, 4,790,258, 4,842,683 and 5,215,619. In order to lower the wafer onto a substrate holder, it is conventional to use a lift pin arrangement such as the type disclosed in the U.S. Pat. No. 4,431,473 wherein four lift pins are arranged in a circular pattern which is concentric with a substrate in the form of a wafer. As shown in FIG. 1, a wafer 2 is supported on a robotic arm 4 and a lift pin mechanism 8 having four lift pins 6 is below the wafer 2. As shown in FIG. 2, the lift pin mechanism can be utilized in semiconductor processing apparatus 10 having an entrance load lock 12, a substrate processing chamber 14 and an exit load lock 16.

A problem with lift pin arrangements is that they are very delicate and the lift pins are extremely easy to bend under a variety of circumstances. For instance, the lift pins can be bent during substrate holder maintenance, substrate handling adjustments, malfunctions of the handler/ESC/clamp, and manual operation of the substrate transport system. Once bent, the lift pins must be removed in order to be repaired. Usually the lift pin assembly must be completely replaced since any repair would require a very delicate, precise operation. Further, problems relating to bending of the lift pins contribute to (1) reduced system up time, (2) longer mean-time-to-repair (MTTR), (3) increased maintenance/parts costs and (4) possibly increased particle levels in the processor.

There is a need in the art for a lift pin arrangement which is more durable and which obviates the disadvantages of the prior art lift pin arrangements. Thus, a lift pin arrangement wherein the lift pins provide longer MTTR and/or in-situ repair potential would overcome a longstanding problem in the art.

SUMMARY OF THE INVENTION

The invention provides lift pins of a lift pin mechanism of a substrate processing apparatus wherein each lift pin is of a shape memory alloy having a memorized configuration. The shape memory alloy is preferably transformable from a martensitic state to an austenitic state and the lift pin is restorable from a deformed configuration to the memorized configuration by heating the lift pin to a temperature at which the shape memory alloy transforms to the austenitic state. The shape memory alloy can have a martensite-to-austenite transformation temperature such as above or below ambient temperature.

The lift pin is preferably supported on a lifter forming part of a substrate holder of a substrate processing apparatus wherein the lifter is movable in a vertical direction between upper and lower positions. The lifter can be movable such that the lift pin has an upper surface located above a substrate support surface of the substrate holder when the lifter is in the upper position and the upper surface of the lift pin is below the substrate support surface when the lifter is in the lower position. Thus, part of the lift pin passes through a lift pin hole in the substrate holder when the lifter moves from the lower position to the upper position. In the case where the lift pin hole also functions to supply heat transfer gas to an underside of the substrate, to allow adequate flow of gas the lift pin can have a cross section which fills 55 to 75% of the lift pin hole. The lift pin can be a rectilinearly extending cylindrical pin press fitted in the lifter and the lifter can be of various materials such as plastic, ceramic or metal or combinations thereof.

The invention also provides a process of moving and optionally processing a substrate from one support surface to another support surface within a substrate processing chamber. In one embodiment, the process includes (1) moving a robotic arm supporting a substrate to be processed such that the substrate is transferred to a process position in a substrate processing chamber, (2) raising a lifter having a plurality of lift pins to an upper position at which the substrate is supported on upper ends of the lift pins, each of the lift pins consisting essentially of a shape memory alloy having a memorized configuration, (3) retracting the robot arm away from the substrate, (4) lowering the lifter to a lower position at which the substrate is supported on a substrate holder in the substrate processing chamber, (5) clamping the substrate to the substrate holder, (6) processing the substrate, (7) unclamping the substrate, (8) raising the lifter to an upper position, and (9) transferring the substrate out of the substrate processing chamber.

In another embodiment, the substrate is supported on the lift pins during transfer of the substrate from one process position to another process position of a substrate processing apparatus. For instance, the process includes (1) moving a first robotic arm supporting a substrate to be transferred such that the substrate is transferred from a first process position to a staging position, (2) raising a lifter having a plurality of lift pins to an upper position at which the substrate is on upper ends of the lift pins, each of the lift pins consisting essentially of a shape memory alloy having a memorized configuration, (3) retracting the first robotic arm away from the substrate, (4) moving a second robotic arm into a position to receive the substrate, (5) lowering the lifter to a lower position so that the substrate is supported by the second robotic arm, and (6) transferring the substrate from the staging position to a second process position.

The transferring or processing can be carried out utilizing for the lift pins a shape memory alloy which is transformable at a temperature above or below ambient from a martensitic state to an austenitic state wherein and the lift pin is restorable from a deformed configuration to the memorized configuration by applying heat to the lift pin or operating the equipment at a temperature which exposes the lift pin to a temperature at which the shape memory alloy transforms to the austenitic state. Thus, the process can include restoring at least one of the lift pins from the deformed configuration to the memorized condition by heating the lift pin to a temperature at which the shape memory alloy transforms from martensitic state to the austenitic state.

In the case of processing the substrate in a substrate processing chamber wherein, the step of processing the substrate can be carried out at cryogenic, ambient or elevated temperatures. In such a process, each of the lift pins can pass through a lift pin hole in a water cooled substrate holder when the lifter moves from the lower position to the upper position and each of the lift pins can have a cross section which fills 55 to 75% of the lift pin hole. The space between the pins and the holes allows pressurized cooling gas to be supplied between the substrate and the substrate holder to allow temperature control of the substrate.

DETAILED DESCRIPTION OF THE INVENTION

Figure 1:
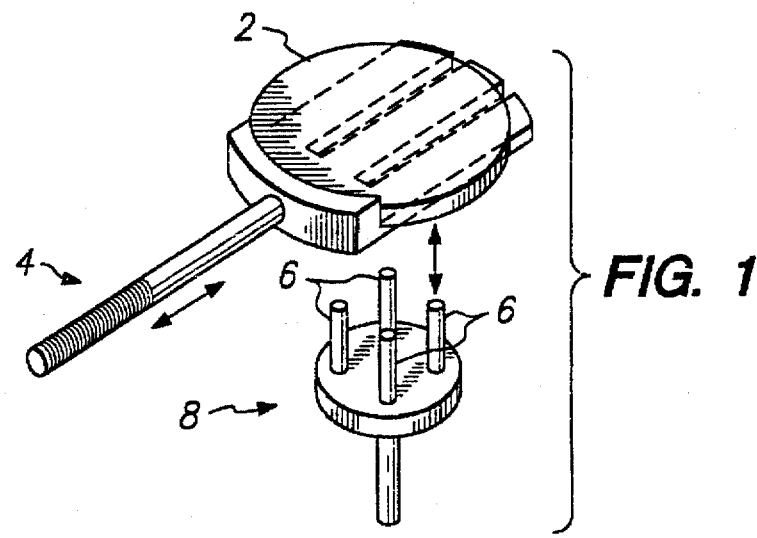
FIG. 1 shows a perspective view of a prior art lift pin arrangement which can incorporate the shape memory alloy lift pins according to the invention.
Figure 2:
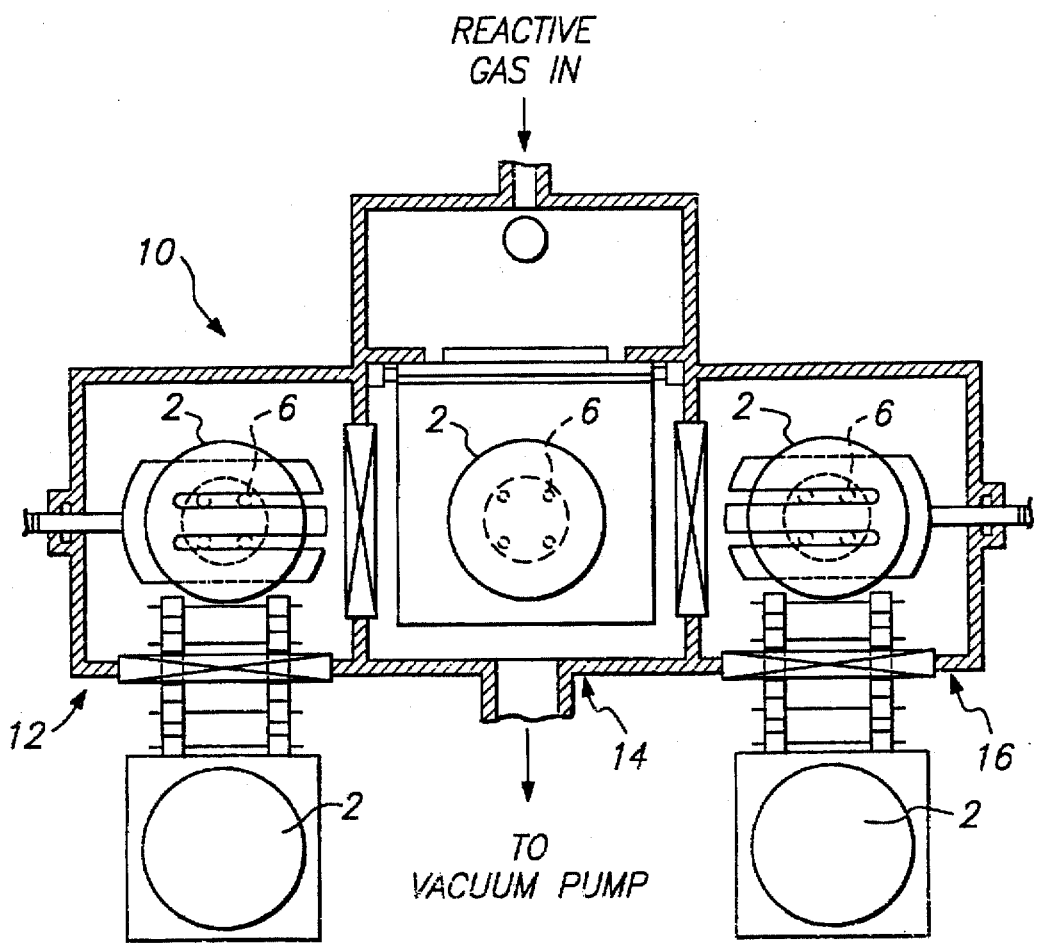
FIG. 2 shows a cross section of a prior art semiconductor processing apparatus.

The invention provides a lift pin mechanism for substrate handling equipment wherein the lift pins have extremely high elasticity and possibly heat recoverability which allows damaged lift pins to be restraightened without removal from the lift pin arrangement. According to the invention, the lift pins are of a superelastic and/or shape memory alloy based on the nickel-titanium system (e.g., Nitinol, a NiTi alloy having 53–57 wt % Ni with or without additional alloying elements). Such materials exhibit the "superelastic effect" where, if subjected to a mechanical strain sufficient to cause substantial bending (e.g., over 3% strain), the material returns immediately to its original shape as soon as the force causing the strain is removed. Thus, in a lift pin arrangement, thin wires of a superelastic alloy can be used to provide a lift pin arrangement which will accommodate dramatic bends of the lift pins without permanent distortion thereof. Further, if the lift pins become deformed, the heat recoverable property of the alloy can be used to recover the original shape of the lift pins.

The superelastic effect is known to occur through the formation of stress-induced martensite. That is, when a shape memory alloy exhibiting stress-induced martensite is stressed at a temperature above $M_s$ (so that the austenitic state is initially stable), but below $M_d$ (the maximum temperature at which martensite formation can occur even under stress) it first deforms elastically and then at a critical stress, begins to transform elastically by the formation of stress-induced martensite. Upon release of the stress, the stress-induced martensite transforms back to austenite and the material returns to its original configuration. Thus, the material can recover elastically from strains of more than 3% and possibly as much as 6 or 8% whereas most conventional materials are permanently deformed when subjected to as little as 1% strain. However, if the amount of stress is sufficient to leave the shape memory alloy material in a deformed configuration after the stress is removed, providing the metal has a "memorized" configuration and level of deformation is not too great, it is possible to return the material to its original memorized configuration simply by heating the material into its austenitic state.

A discussion of effects of shape memory alloys and the stress-induced martensite transformation is provided in U.S. Pat. No. 4,665,906 and in a Materials Research Society Publication entitled "Designing With the Shape Memory Effect" by T. W. Duerig et al., MRS Int'l Mtg. on Adv. Mats., Vol. 9 (1980). Further, heat-treatments of shape memory alloys have generally been conducted by solution-treatment at high temperature followed by quenching rapidly into water in order to obtain a high temperature single phase which causes the shape memory effect to appear, as explained in an article by K. Otsuka et al. entitled "Development of Energy-Saving Materials Using Superelasticity," SPEY 14 (January 1985). The superelasticity of such alloys, however, can be enhanced by aging the material to produce fine precipitates, as explained by Otsuka et al.

The temperature at which the shape memory alloy transforms from the martensitic to the austenitic state can be adjusted by appropriate thermomechanical treatment and/or alloying of the shape memory alloy. For instance, U.S. Pat. No. 4,894,100 discloses a Ni-Ti-V alloy wherein the $M_s$ temperature can be adjusted by varying the Ni/Ti ratio and V content. The '100 patent discloses that an $M_s$ of 20°–70° C. can be provided by adjusting the ratio of Ni/Ti to 0.96–1.02 whereas an $M_s$ of −150° to 20° C. can be provided by adjusting the ratio of Ni/Ti to 1.0–1.06. When such an alloy is heat treated at 425°–525° C. after being cold worked, an $M_s$ of −10° to 20° C. can be provided. Thus, various alloys and thermomechanical treatments thereof can be utilized to provide the lifting pins in accordance with the invention.

According to the invention, the lift pins can be of a shape memory material such as Nitinol which is formed into a memorized configuration by appropriate thermomechanical treatment. For instance, the lift pins can be rectilinearly extending cylindrical Nitinol pins which have an $M_s$ no greater than 25° C., e.g., 5° C. However, if desired, the lift pins can have an $M_s$ of greater than 25° C. According to a preferred embodiment, the lift pins are operated in an environment in which the lift pins are normally in the austenitic condition. Thus, the lift pins will exhibit the superelastic effect as a result of the ability to form stress-induced martensite. However, the lift pins can also be used in an environment in which the lift pins are in the martensitic condition. In either case, if the lift pins are deformed in the martensitic state beyond the elastic limit, the lift pins can be restored to their memorized configuration simply by heating the lift pins into the austenitic state.

The lift pin arrangement can be used in various parts of substrate processing apparatus such as in load locks and/or substrate processing chambers. The substrate can be transferred by robotic arm or other suitable mechanism to a position at which lift pins lift the substrate off of a support surface of the robotic arm, the robotic arm is withdrawn and the substrate is lowered onto a support surface of the same or another robotic arm, a substrate holder, or the like.

The substrate processing chamber can be used to perform various treatments such as etching, deposition, resist stripping, photolithography, CVD, RTP, ion implantation or sputtering, or the like, on the substrate supported on the substrate holder. For instance, if the substrate comprises a semiconductor wafer, etching layers such as polysilicon, oxide or a metal such as aluminum or tungsten can be carried out in a substrate processing chamber. In the case of oxide etching, the temperature within the substrate processing chamber can be maintained below 0° C. such as at about −20° C. In such a case, if the lift pins have an $M_s$ of 5° C., the lift pins will be in the martensitic state during the etching process and if the lift pins become bent as a result of movement and/or supporting the wafer during transfer thereof into or out of the substrate processing chamber or into or out of contact with the substrate holder, the lift pins can be restored to their original memorized straight condition simply by allowing the substrate processing chamber to heat the lift pins to room temperature. Thus, the lift pins will transform from the martensitic to the austenitic state and the lift pins will automatically straighten as a result of the martensitic-to-austenitic phase change. The heating to heat recover the memorized shape can also be achieved by other techniques such as by applying a sufficient electrical current through the lift pins or by heating the lift pins with a heat gun.

During processing of a substrate in the substrate processing chamber, the substrate can be supported on the substrate holder by any suitable restraining apparatus. For instance, the substrate holder can incorporate an electrostatic chucking or ESC arrangement for clamping the substrate to the substrate holder. Alternatively, a mechanical clamping arrangement can be provided for holding the substrate to the substrate holder. For instance, if the substrate comprises a semiconductor wafer, a clamping ring can be used to clamp the wafer to the substrate holder.

During some substrate processing procedures, it is conventional to cool the back or reverse side of the substrate by flowing helium gas between the underside of the substrate and the substrate holder. The holes through which the lift pins travel to lift the substrate above the substrate holder can serve an additional function of allowing helium gas to pass through the substrate holder into contact with the underside of the substrate. According to the invention, the lift pins remain at least partially in the holes in the substrate holder when the lifter assembly is in the bottom position and the clearance between the lift pins and the holes is maintained such that sufficient helium flows to the backside of the substrate.

The invention is now described with reference to the following example. However, the invention can be embodied in other lift pin arrangements wherein alternative lift pin dimensions, cross-sections, tip geometries and $M_s$ temperature and parts of the lift pin arrangement will be apparent to the skilled artisan.

EXAMPLE

Figure 3:
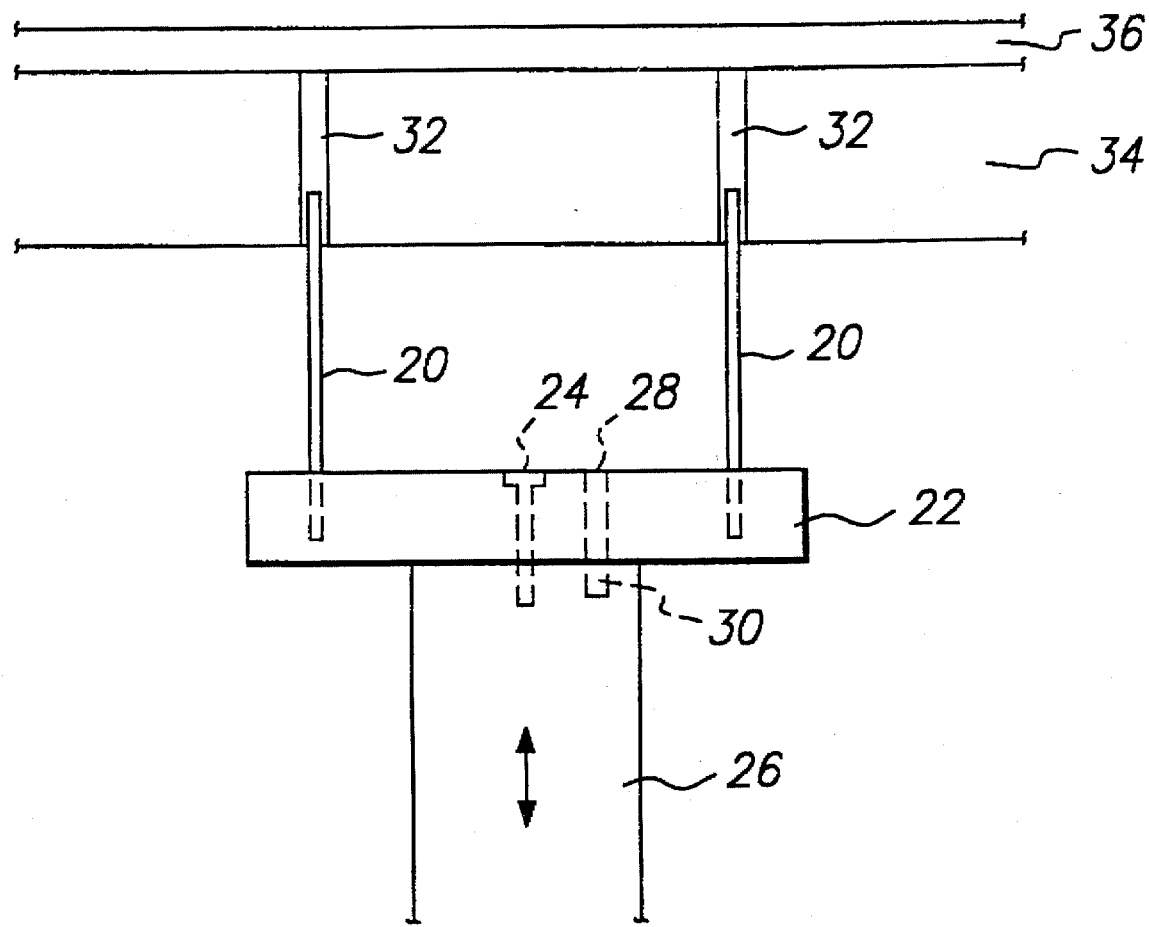
FIG. 3 shows a cross section of a lift pin arrangement according to the invention.

According to an exemplary embodiment of the invention shown in FIG. 3, the lift pins are of Nitinol having an $M_s$ of 5° C. As shown in FIG. 3, the lift pins 20 comprise thin wires press fitted in four holes of a lifter 22. The lifter 22 includes a central hole 24 through which a screw passes for attaching the lifter 22 to a pneumatic or mechanical actuator 26. In the embodiment shown, the lifter 22 has a thickness of about 0.2 inch and a diameter of about 1.6 inch and the lift pins 20 are located about 0.1 inch inside of the outer periphery of the lifter 22. Thus, the lift pins are spaced diagonally apart by about 1.4 inch. The lifter also includes an alignment hole 28 for purposes of aligning the lifter 22 with a corresponding hole 30 in the actuator 26 when the lifter 22 is assembled in a plasma treating apparatus. The lift pins have a length of about 1 inch and a diameter of about 0.03 inch. The lift pins pass through corresponding holes 32 in a substrate holder 34 in a substrate processing chamber and such holes in the substrate holder have a diameter of about 0.04 inch. Thus, sufficient clearance is provided between the periphery of the lift pins and the inner periphery of the holes 32 in the substrate holder to allow passage of a suitable cooling gas such as helium into contact with the reverse side of a substrate 36 treated in the substrate processing chamber. The ratio of the cross section of the lifting pin versus the cross section of the corresponding hole in the substrate holder can range from 55 to 75%, preferably being about 60%. However, in the case where the lift pin holes are not used to supply cooling gas such as helium between the substrate and the substrate holder, any amount of clearance can be provided between the lift pins and the lift pin holes.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A lift pin of a lift pin mechanism of a substrate processing apparatus, the lift pin consisting essentially of a shape memory alloy having a memorized configuration.

2. The lift pin of claim 1, wherein the shape memory alloy is transformable from a martensitic state to an austenitic state, the lift pin being restorable from a deformed configuration to the memorized configuration by heating the lift pin to a temperature at which the shape memory alloy transforms to the austenitic state.

3. The lift pin of claim 1, wherein the shape memory alloy is a nickel titanium alloy having a martensite-to-austenite transformation temperature below ambient.

4. The lift pin of claim 1, wherein the lift pin is supported on a lifter forming part of a substrate holder of a substrate processing chamber, the lifter being movable in a vertical direction between upper and lower positions, the lift pin having an upper surface located above a substrate support surface of the substrate holder when the lifter is in the upper position and the upper surface of the lift pin being below the substrate support surface when the lifter is in the lower position.

5. The lift pin of claim 4, wherein part of the lift pin passes through a lift pin hole in the substrate holder when the lifter moves from the lower position to the upper position.

6. The lift pin of claim 5, wherein the lift pin has a cross section which fills 55 to 75% of the lift pin hole.

7. The lift pin of claim 1, wherein the lift pin is supported on a lifter of a substrate processing apparatus, the lifter being movable in a vertical direction.

8. The lift pin of claim 1, wherein the lift pin is a rectilinearly extending cylindrical pin press fitted in a lifter of a lift pin mechanism.

9. The lift pin of claim 8, wherein the lifter is of plastic, ceramic or metal material.

10. A process of treating a substrate in a substrate processing chamber, comprising:

moving a substrate to be processed to a process position in a substrate processing chamber;

raising a lifter having a plurality of lift pins to an upper position at which the substrate is supported on upper ends of the lift pins, each of the lift pins consisting essentially of a shape memory alloy having a memorized configuration;

lowering the lifter to a lower position at which the substrate is supported on a substrate holder in the substrate processing chamber;

treating the substrate with the process;

raising the lifter to the upper position; and transferring the substrate out of the substrate processing chamber.

11. The process of claim 10, wherein the shape memory alloy is a nickel titanium alloy which is transformable from a martensitic state to an austenitic state, the lift pin being restorable from a deformed configuration to the memorized configuration by heating the lift pin to a temperature at which the shape memory alloy transforms to the austenitic state.

12. The process of claim 11, further comprising restoring at least one of the lift pins from the deformed configuration to the memorized condition by heating the lift pin to a temperature at which the shape memory alloy transforms from the martensitic state to the austenitic state.

13. The process of claim 10, wherein the step of processing the substrate is carried out at a temperature no greater than 0° C.

14. The process of claim 10, wherein the step of processing the substrate is carried out at a temperature no lower than 0° C.

15. The process of claim 10, wherein each of the lift pins passes through a hole in the substrate holder when the lifter moves from the lower position to the upper position.

16. The process of claim 15, wherein each of the lift pins has a cross section which is at least 55% as large as the cross section of the hole.

17. The process of claim 16, wherein the cross section of each of the lift pins is no greater than 75% of the cross section of the hole.

18. The process of claim 10, wherein the lift pins extend through holes in the substrate holder, at least part of the lift pins being in the holes when the lifter is lowered to the lower position.

19. The process of claim 10, wherein the shape memory alloy has a martensite-to-austenite transformation temperature of no less than 25° C.

20. The process of claim 10, wherein the shape memory alloy has a martensite-to-austenite transformation temperature of greater than 25° C.

21. A process of transporting a substrate in a substrate processing apparatus, comprising:

moving a substrate to be processed to a first process position in a first part of the substrate processing apparatus;

raising a lifter having a plurality of lift pins to an upper position at which the substrate is supported on upper ends of the lift pins, each of the lift pins consisting essentially of a shape memory alloy having a memorized configuration; and moving the substrate to a second process position by lowering the lifter to a lower position at which the substrate is supported on a support surface.

22. The process of claim 21, wherein the shape memory alloy is a nickel titanium alloy which is transformable from a martensitic state to an austenitic state, the lift pin being restorable from a deformed configuration to the memorized configuration by heating the lift pin to a temperature at which the shape memory alloy transforms to the austenitic state.

23. The process of claim 21, wherein the shape memory alloy has a martensite-to-austenite transformation temperature of no less than 25° C.

24. The process of claim 21, wherein the shape memory alloy has a martensite-to-austenite transformation temperature of greater than 25° C.

25. The process of claim 21, wherein the support surface is an upper surface of a movable robotic arm.

* * * * *

UNITED STATES PATENT AND TRADEMARK OFFICE
CERTIFICATE OF CORRRECTION

PATENT NO. : 5,669,977
DATED : September 23, 1997
INVENTOR(S) : Paul K. Shufflebotham, et al.

It is certified that error appears in the above-identified patent and that said Letters Patent is hereby corrected as shown below:

On the title page, insert item [56]:

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 0 | 6 | 15 | 1 | 3 | 6 | 6 | 05/1994 | Japan | | | | |
| | | 6 | 0 | 16 | 7 | 3 | 4 | 6 | 08/1985 | Japan | | | | |
| | | | | | | | | | | | | | | |

Signed and Sealed this

Sixteenth Day of March, 1999

Attest:

Q. TODD DICKINSON

*Attesting Officer*   *Acting Commissioner of Patents and Trademarks*